United States Patent
Ghaderi et al.

[11] Patent Number: 5,870,002
[45] Date of Patent: Feb. 9, 1999

[54] PHASE-FREQUENCY LOCK DETECTOR

[75] Inventors: Mir Bahram Ghaderi, Cupertino; Vincent W. S. Tso, Milpitas, both of Calif.

[73] Assignee: Exar Corporation, Fremont, Calif.

[21] Appl. No.: 880,656

[22] Filed: Jun. 23, 1997

[51] Int. Cl.$^6$ .................................................. H03L 7/095
[52] U.S. Cl. ........................... 331/17; 331/1 A; 331/8; 331/25; 331/DIG. 2; 327/156
[58] Field of Search ......................... 331/1 A, 8, 17, 331/25, DIG. 2; 327/105, 156–159

[56] References Cited

U.S. PATENT DOCUMENTS

| | | | |
|---|---|---|---|
| 4,437,072 | 3/1984 | Asami | 331/1 A |
| 4,499,434 | 2/1985 | Thompson | 331/17 |
| 4,774,480 | 9/1988 | Sato et al. | 331/1 A |
| 4,806,878 | 2/1989 | Cowley | 331/1 A |
| 4,862,105 | 8/1989 | Walbrou et al. | 331/DIG. 2 X |
| 4,870,382 | 9/1989 | Keate et al. | 331/4 |
| 5,008,635 | 4/1991 | Hanke et al. | 331/DIG. 2 X |
| 5,099,213 | 3/1992 | Yamakawa et al. | 331/4 |
| 5,122,762 | 6/1992 | Molina et al. | 331/1 A |
| 5,126,690 | 6/1992 | Bui et al. | 331/DIG. 2 X |
| 5,256,989 | 10/1993 | Parker et al. | 331/1 A |
| 5,278,520 | 1/1994 | Parker et al. | 331/1 A |
| 5,327,103 | 7/1994 | Baron et al. | 331/1 A |
| 5,394,444 | 2/1995 | Silvey et al. | 375/374 |
| 5,444,394 | 8/1995 | Watson et al. | 326/45 |
| 5,574,406 | 11/1996 | Sauer et al. | 331/11 |
| 5,574,407 | 11/1996 | Sauer et al. | 331/14 |
| 5,668,503 | 9/1997 | Gersbach et al. | 331/1 A |
| 5,719,532 | 2/1998 | Nayebi et al. | 331/DIG. 2 X |
| 5,724,007 | 3/1998 | Mar | 331/1 A |

*Primary Examiner*—David Mis
*Attorney, Agent, or Firm*—Townsend and Townsend and Crew LLP

[57] ABSTRACT

A method and circuitry for detecting when a PLL achieves phase and frequency-lock to a reference frequency with minimal hardware and power dissipation are disclosed. The invention takes advantage of existing blocks within a PLL to reduce the amount of circuitry required while at the same time reducing error due to mismatch. In one embodiment, the present invention combines a coarse lock-detect circuit with a fine lock-detect circuit to achieve fast response when the input reference is lost, while filtering occasional minor phase hits due to external or internal noise.

19 Claims, 4 Drawing Sheets

PHASE-FREQUENCY LOCK DETECTOR

BACKGROUND OF THE INVENTION

The present invention relates in general to integrated circuits, and in particular to a an improved lock-detect circuit for systems using phase-locked loops.

A phase-locked loop (PLL) is a circuit that operates to bring the phase of the output signal of a voltage-controlled oscillator (VCO) in alignment with that of a reference input signal. One common application for PLLs is in frequency synthesizers where a stable reference input clock is used to generate different frequencies. A conventional PLL includes a phase comparator that receives the reference input signal and the output of the VCO, and detects a phase difference therebetween. The error signal that represents the phase difference at the output of the phase comparator is then filtered and applied to the VCO to control its output frequency. By adjusting the phase of the VCO output signal in response to the magnitude of the phase error signal, this servo loop operates to minimize the error signal and to lock the phase of the reference signal with that of the input signal.

A PLL may fail to phase-lock and/or frequency-lock to the reference input frequency under several conditions. Some of these conditions are part of the normal operation and happen at expected times such as during the acquisition, or frequency transition modes. Other conditions are not part of the normal operation and are often unpredictable. These include loss of lock due to loss of input signal or significant degradation of the quality of the input signal (e.g., excessive jitter or modulation).

In many applications, it is crucial for the system to know at all times whether the system clock, which is usually generated by a PLL, is in lock condition in order to ensure data integrity. Hence, a lock-detect circuit becomes necessary.

Of the various lock-detect circuits that have been proposed, some require large frequency counters to monitor the frequency of the reference input signal and the signal at the output of the VCO divider. These schemes consume large area of silicon and power, and are only for frequency lock detection, not phase lock detection. Further, existing lock-detect circuits typically do not address the failure to lock situation when the reference frequency disappears or deviates significantly from the intended frequency.

There is therefore a need for an area and power efficient implementation of a lock-detect circuit that operates reliably under all conditions.

SUMMARY OF THE INVENTION

The present invention provides method and circuitry for detecting when a PLL achieves phase- and frequency-lock to a reference frequency with minimal hardware and power dissipation. The invention takes advantage of existing blocks within a PLL to reduce the amount of circuitry required while at the same time reducing error due to mismatch. Broadly, the present invention combines a coarse lock-detect circuit with a fine lock-detect circuit to achieve fast response when the input reference is lost, while filtering occasional minor phase hits due to external or internal noise.

Accordingly, in one embodiment, the present invention provides for use with a phase-locked loop (PLL), a circuit for detecting a lock condition including a coarse lock-detect circuit having an input coupled to an output of the PLL, and a fine lock-detect having an input coupled to the output of the PLL. A combine circuit logically combines an output of the coarse lock-detect with the output of the fine lock-detect to generate the final lock-detect output.

In a more specific embodiment, the input of the coarse lock-detect circuit and the input of the fine lock-detect circuit couple to an output of a phase comparator inside the PLL and receive the phase comparator output error signal. The coarse lock-detect circuit includes a current source that is controlled by the error signal, and a capacitor that is charged by the current source or discharged by a switch. A comparator coupled to the capacitor then decides whether phase/frequency lock has been achieved within a predefined window. The fine lock-detect circuit includes circuitry that generates a predefined window that is smaller than the window used in the coarse lock-detect circuit and checks for phase/frequency lock within the smaller window.

A better understanding of the nature and advantages of the lock-detect circuit of the present invention may be gained with reference to the detailed description and drawings below.

DESCRIPTION OF THE PREFERRED EMBODIMENT

Figure 1:
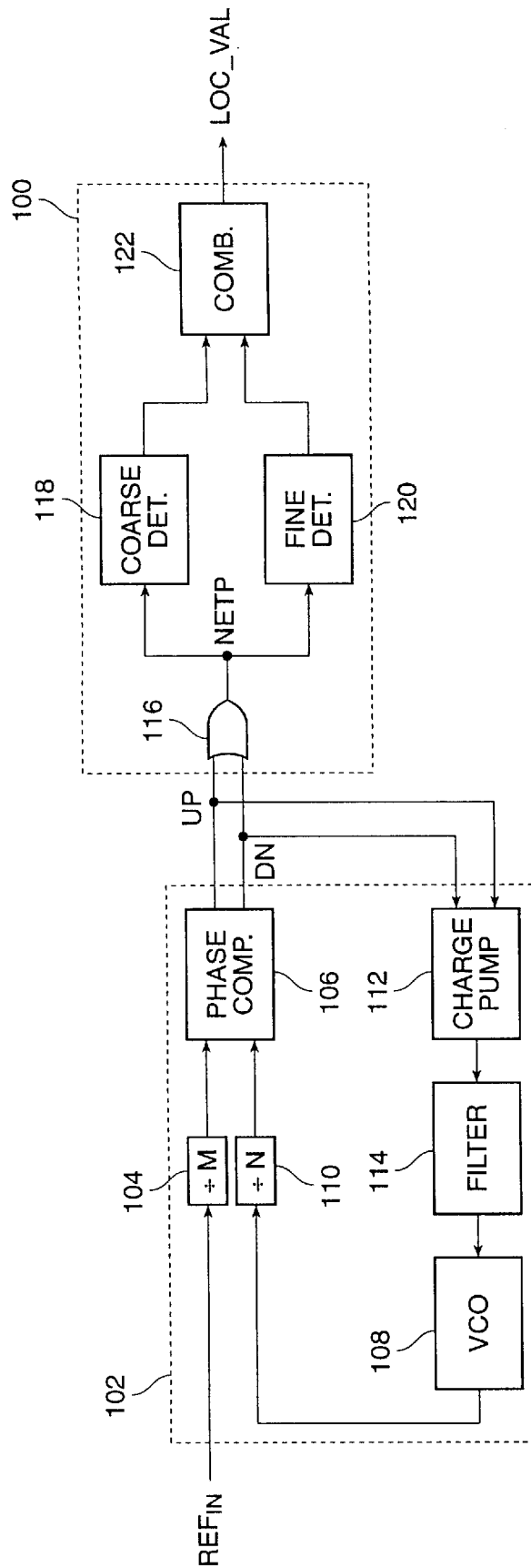
FIG. 1 is a block diagram of a preferred embodiment of the lock-detect circuit of the present invention.

Referring to FIG. 1, there is shown a block diagram of a preferred embodiment of the lock-detect circuit 100 of the present invention in combination with a phase-locked loop (PLL) 102. PLL 102 receives the reference input signal $Ref_{in}$ and after dividing its frequency (104), applies it to one input of a phase/frequency comparator 106. The other input of phase/frequency comparator 106 receives the output of a VCO 108 that has been divided down by a divider 110. Phase/frequency comparator 106 compares phase and frequency of the two signals and generates UP or DN pulses depending on whether the VCO output signal lags or leads in phase compared to the reference signal. The UP and DN pulses control the operation of a charge pump circuit 112 whose output is filtered by filter 114. The output of filter 114 then supplies the control voltage to VCO 108. The frequency of the oscillator in VCO 108 is thus adjusted by the control voltage to bring the phase/frequency of the VCO output signal closer to the reference signal.

Instead of having separate circuitry (external to the PLL) to compare the phase/frequency of the reference input signal with the VCO output signal for lock detection purposes, the lock-detect circuit 100 of the present invention utilizes the UP and DN pulses from the phase/frequency comparator 106. This not only reduces the amount of circuitry, it eliminates potential error introduced by mismatches between an external phase/frequency detector and that of the PLL. Lock-detect circuit 100 relies on the ability of phase/frequency comparator 106 to generate UP and DN pulses when the inputs of the phase comparator are phase and frequency aligned. Many of today's PLL circuits continue to generate UP and DN pulses of predefined duration even after there has been a phase/frequency alignment to reduce or eliminate what is commonly referred to as the 'dead-band' effect. This is accomplished by generating UP and DN pulses with a predefined duration that is longer than the response time of the phase comparator and the charge-pump in the PLL, after phase/frequency alignment has been achieved. By combining the UP and DN pulses and comparing the duration of the resulting pulse with a predefined window, the present invention detects whether a lock condition has been achieved.

FIG. 1 shows one embodiment of the present invention that takes advantage of the UP and DN pulses generated by the phase/frequency comparator of the PLL. Lock-detect circuit 100 as shown in FIG. 1 first performs a logic OR function (116) on the UP and DN pulses from phase/frequency comparator 106 and then feeds the resultant pulse NETP to inputs of a coarse lock-detector 118 and a fine lock-detector 120. A combine circuitry 122 combines the outputs of both coarse and fine lock-detectors to generate the final output signal LOC_VAL that indicates a valid lock.

Figure 2:
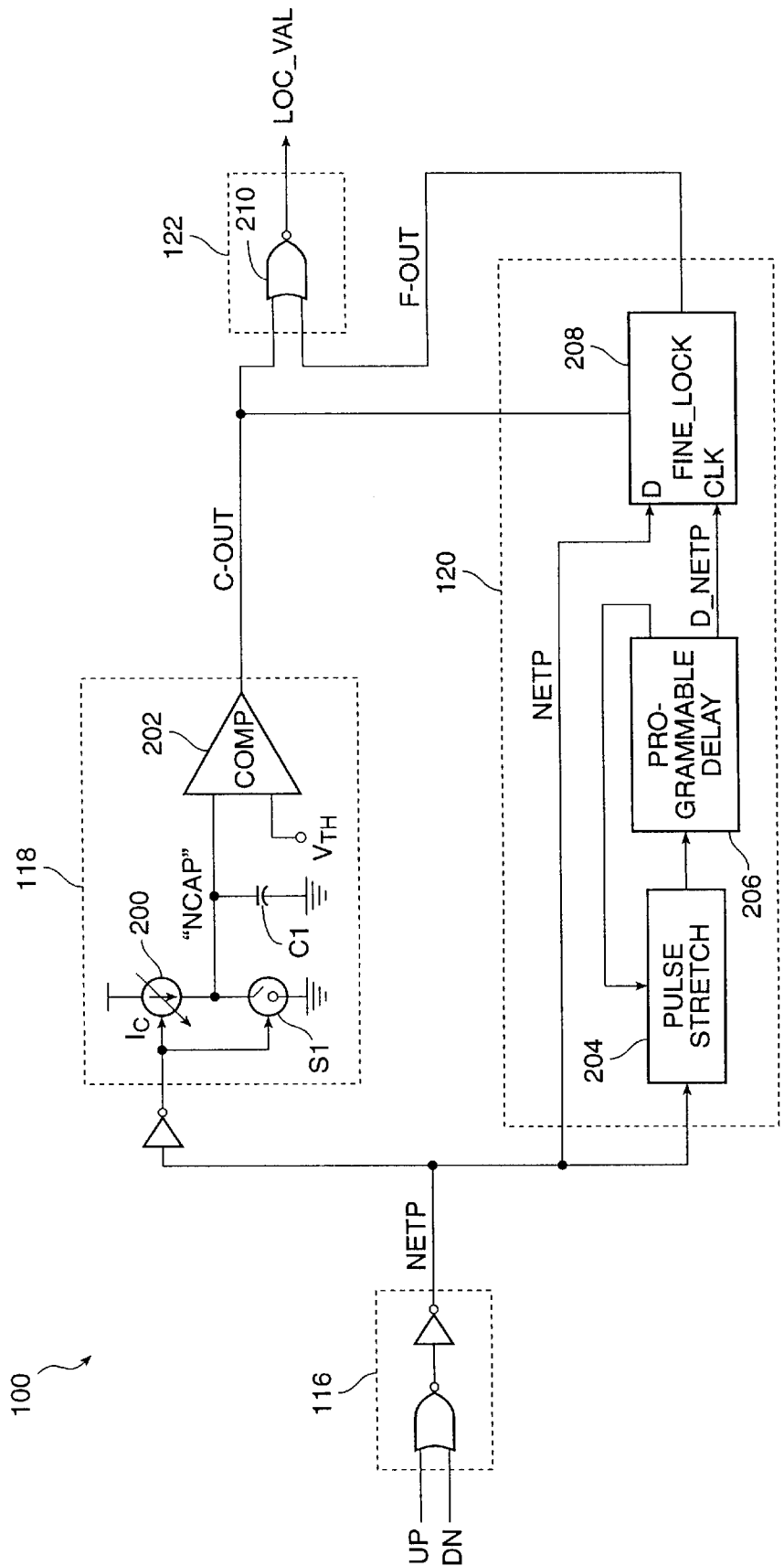
FIG. 2 shows an exemplary circuit implementation for the lock-detect circuit of the present invention.

Referring to FIG. 2, there is shown an exemplary circuit implementation for lock-detect circuit 100. As discussed above, coarse detector 118 detects gross frequency/phase mismatch between the inputs of the phase/frequency comparator 106 by checking the duration of the NETP pulse against a predefined window. Coarse detector 118 is primarily active during the phase capture and loss of reference signal. Under either one of these conditions, one of the pulse signals UP or DN has a much wider (positive) pulse width indicating gross mismatch in the phase/frequency of the two signals. As the PLL operates to bring the phases in alignment, the pulse width of UP or DN narrows until it reaches its minimum duration.

The principals of operation of coarse detector 118 will be described hereinafter. Referring to FIG. 2, the pulse NETP resulting from the OR of the UP and DN signals, is inverted and then applied to a current source 200 that charges a capacitor C1, and a switch S1 that, when closed, discharges capacitor C1. Switch S1 provides for a very fast discharge of capacitor C1 when current source 200 is turned off. The state of NETP controls when and for how long current source 200 is turned on and charging capacitor C1 with a predefined current Ic. A comparator 202 compares the voltage on the top plate of capacitor C1, node NCAP, with a predefined threshold voltage Vth. Therefore, under the loss of reference signal condition, for example, OR gate 116 generates a relatively wider positive pulse at NETP. Current source 200 is activated in response to NETP having a high logic level. Capacitor C1 is thus charged by current Ic for as long as NETP remains high. If NETP remains high long enough to charge cap C1 to a voltage above Vth of comparator 202, the output of comparator 202, C_OUT will change state from logic low to logic high. The assertion of C_OUT indicates that the inputs of the phase/frequency comparator (106 in FIG. 1) are grossly out of phase.

Figure 3:
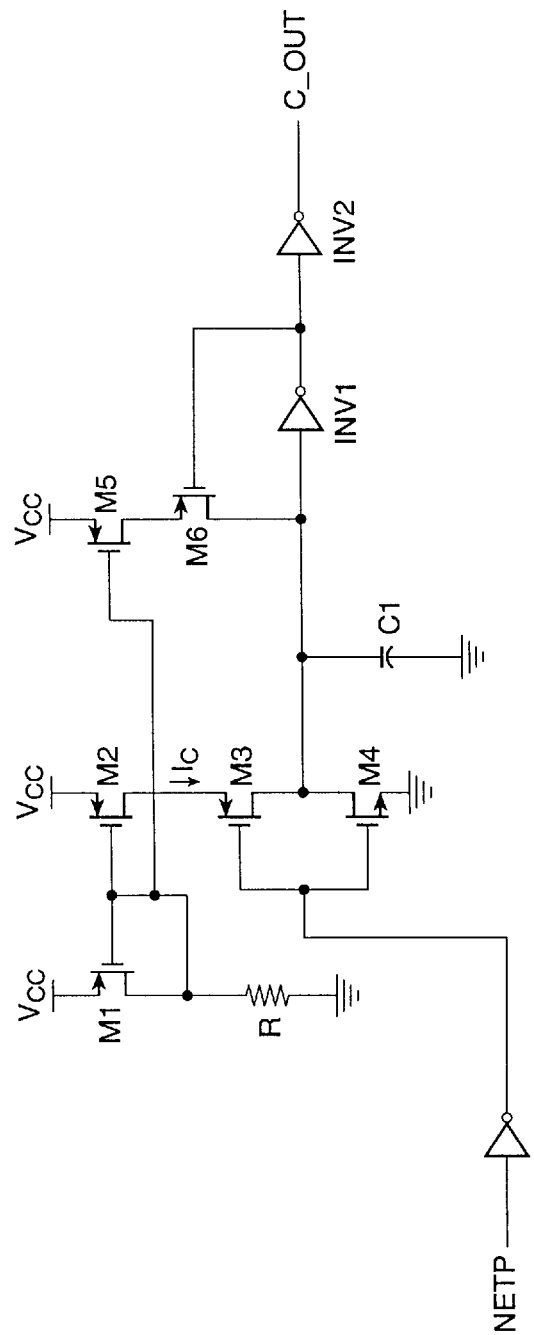
FIG. 3 is a more detailed schematic diagram of an exemplary circuit implementation of the coarse lock-detector of the present invention.

Figure 3 shows an exemplary circuit implementation for coarse detector 117. The combination of resistor R and transistors M1 and M2 generates the current Ic. Transistors M3 and M4 operate in response to the inverse of NETP signal to either charge C1 (when M4 is OFF and M3 is ON), or discharge C1 (when M4 is ON and M3 is OFF) as described above. An inverter INV1 performs the compare function of comparator 202 (in FIG. 1). In this particular embodiment, a feedback circuit including transistors M5 and M6 provide a degree of hysteresis to avoid accidental toggling of the C_OUT signal.

Depending on the specific requirement of the PLL, the magnitude of Ic and capacitance of C1 can be adjusted, to change the duration of time Tc needed for Ic to charge C1 up to Vth. That is, the combination of Ic and C1 adjust the size of the window for coarse detection. For example, a duration of about 10% of the output period may be used for Tc.

The output C_OUT of coarse detector 118 also controls fine detector 120. The signal C_OUT is used to reset the state of fine detector 120 and hence prohibit the fine detector 120 to operate. Thus, as long as coarse detector 118 has not qualified the signal, fine detector 120 remains in a reset state. This ensures that in case of gross errors that may not be detected by fine detector 120, the output of coarse detector 118 overrides the operation of the circuit. For example, because fine detector 120 integrates the results from several cycles before it changes state, it will not detect a sudden loss of one cycle and will thus erroneously stay in the lock state. Such a gross phase error, however, would be detected by coarse detector 118 whose output shuts off fine detector 120 so that the circuit correctly detects the failure to lock condition.

After coarse detector determines that the phase error is less than Tc (i.e., less than the coarse window), it releases fine detector 120. Fine detector 120 checks the phase error represented by NETP against a tighter window. In addition, it digitally integrates the results from several cycles before deciding on fine lock or loss thereof. Fine detector 120 is primarily activated when the PLL is in lock condition to detect occasional minor phase errors. As discussed above, under lock condition, phase/frequency comparator 106 generates UP and DN signals having a minimum pulse width Tmin. Fine detector 120 utilizes these pulses to perform its detect operation.

Referring back to FIG. 2, fine detector 120 includes a pulse stretch circuit 204 that receives NETP that in combination with a programmable delay circuit 206 operates to widen the duration of the high level of the NETP pulse. The amount of delay Tf introduced by delay circuit 206 sets the finer window for detection and can be digitally adjusted. The stretched NETP pulse, or D_NETP, is then fed to the input of a FINE_LOCK circuit 208. FINE_LOCK circuit 208 includes a D-type flip flop circuit (described in greater detail in connection with FIG. 4) that receives D_NETP at its clock input and NETP at its D input. The widening of the NETP pulse ensures that the clock signal for the flip flop inside FINE_LOCK circuit 208 is wide enough to satisfy the setup and hold time requirements.

With NETP at its D input and D_NETP applied to the clock input, a logic low level at the output of the flip flop indicates that NETP is shorter than the delay Tf, indicating fine lock. Conversely, a logic high level at the output of the flip flop indicates that NETP is wider than delay Tf, indicating loss of fine lock. The amount of delay Tf is adjusted such that it is larger than Tmin but is considerably smaller than Tc in coarse detector 118. In this fashion, coarse detector 118 uses a larger window Tc to detect gross phase/frequency mismatches, while fine detector 120 uses a tighter window Tf to detect the minor phase/frequency drifts.

Combine circuit 122 can be implemented by, for example, a NOR gate 210. Therefore, the final output signal LOCK_VAL is at logic high level indicating a valid lock only when both C_OUT and F_OUT are at logic low level. That is, only when both coarse detector 118 and fine detector 120 agree that a lock condition has been achieved, is the signal LOCK_VAL asserted.

Figure 4:
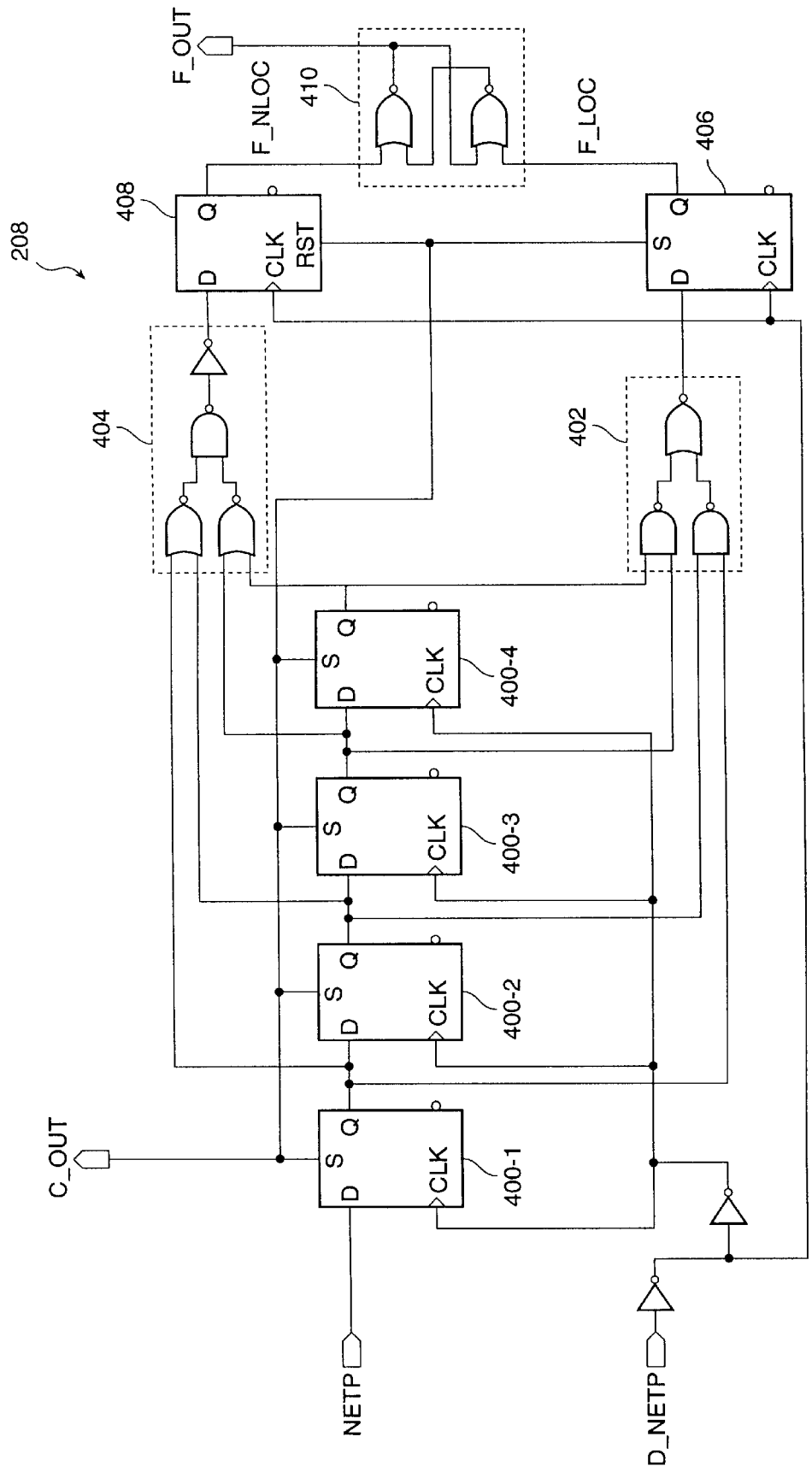
FIG. 4 is a more detailed schematic diagram of an exemplary circuit implementation of a fine lock-detector according to the present invention.

To avoid chattering of the output signal LOCK_VAL, fine detector 120 integrates the results from several cycles before changing the state of the F_OUT signal. The present invention accomplishes this by using several (e.g., four) flip flops in FINE_LOCK circuit 208. Referring to FIG. 4, there is shown an exemplary circuit implementation of FINE_LOCK circuit 208. The circuit includes four D-type flip flops 400-1, 400-2, 400-3, 400-4 connected in a shift register fashion. Each flip flop 400 receives the D_NETP signal (buffered by two inverters) at its clock input. First flip flop 400-1 receives NETP at its D input, while each of the other flip flops receives the Q output of the preceding flip flop. The outputs of all four flip flops are respectively connected to inputs of a four-input AND circuit 402 and a four-input NOR circuit 404. To eliminate glitching, the outputs of AND 402 and NOR 404 are resynchronized with the falling edge of D_NETP by flip flops 406 and 408, respectively. The resynchronized output of the AND 402, F_LOC, resets a latch 410, while resynchronized output of NOR, F_NLOC, sets latch 410. Each flip flop 400 also receives the output of coarse detector, signal C_OUT, at a set input. As discussed above, this deactivates fine detector 208 for as long as coarse detector 118 has not detected a lock condition (i.e., C_OUT is at logic high level).

Accordingly, four consecutive samples of 1's or 0's are needed for F_OUT to change state. This provides integration and hysteresis for fine detector 120. The amount of integration and hysteresis in FINE_LOCK circuit 208 can be easily adjusted by changing the number of flip flops 400. In one embodiment, the present invention includes additional flip flops 400 with wider AND 402 and NOR 404 circuits, where the flip flops can be digitally set (or reset) to reduce the amount of integration, or enabled to increase the amount of integration.

In conclusion, the present invention provides an improved lock detect circuit that requires less circuitry and consumes less power, while operating more reliably. By utilizing the output of the phase/frequency comparator inside the PLL, the circuit of the present invention reduces the circuit size and eliminates potential error caused by mismatches. Further, the circuit includes separate coarse and fine detector blocks to allow for a faster and more accurate detection of lock or loss of lock conditions. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. For use with a phase-locked loop (PLL) having a phase comparator, a circuit for detecting a lock condition comprising:
   a coarse lock detector having an input coupled to an output of the phase comparator, said coarse lock detector detecting a phase lock within a first window of time;
   a fine lock detector having an input coupled to said output of the phase comparator, said fine lock detector detecting a phase lock within a second window of time that is shorter in duration than said first window of time; and
   a combine circuit receiving an output of said coarse lock detector and an output of said fine lock detector and generating a final lock-detect output signal.

2. The circuit of claim 1 wherein said coarse lock detector comprises:
   a current source circuit having a control input coupled to the PLL, said current source circuit generating a current Ic;
   a capacitor coupled to said current source circuit;
   a discharge circuit having a control input coupled to the PLL, said discharge circuit being coupled to said capacitor; and
   a compare circuit coupled to said capacitor, said compare circuit generating a coarse detect output signal when a potential level on said capacitor goes above or below a predefined threshold level.

3. The circuit of claim 2 further comprising a feedback circuit coupled between an output and an input of said compare circuit for providing a degree of hysteresis.

4. The circuit of claim 1 wherein said fine lock detector comprises:
   a delay circuit coupled to the PLL, said delay circuit causing a widening of a PLL output pulse; and
   a flip flop circuit having a first input coupled to receive said PLL output pulse, and a clock input coupled to an output of said delay circuit, said flip flop circuit generating a fine detect output signal.

5. The circuit of claim 4 wherein said flip flop further includes a disable input coupled to an output of said coarse lock detector circuit.

6. The circuit of claim 4 wherein said flip flop circuit comprises a plurality of flip flop elements each receiving said output of said delay circuit at a clock input, and each having an input and an output coupled in a shift register fashion.

7. The circuit of claim 6 wherein said fine lock detector further comprises:
   a first logic circuit having a plurality of inputs respectively coupled to outputs of said plurality of flip flops, said first logic circuit detecting when the output state of all of said plurality of flip flops are at a logic high level; and
   a second logic circuit having a plurality of inputs respectively coupled to outputs of said plurality of flip flops, said second logic circuit detecting when the output state of all of said plurality of flip flops are at a logic low level.

8. The circuit of claim 7 wherein said fine lock detector further comprises a latch circuit having a first input coupled to an output of said first logic circuit, and a second input coupled to an output of said second logic circuit.

9. For use with a phase-locked loop (PLL) having a phase comparator that generates UP and DN pulses in response to a phase difference between a reference signal and a PLL signal, a circuit for detecting a phase lock between the reference signal and the PLL signal, the circuit comprising:
   a logic circuit having a first input coupled to receive said UP pulse and a second input coupled to receive said DN pulse, said logic circuit for performing a logic OR function on said UP and DN pulses to generate a combined pulse at an output; and
   a lock detect circuit comprising:
      a coarse lock detector having an input coupled to said output of said logic circuit, said coarse lock detector detecting a phase lock within a first window of time;
      a fine lock detector having an input coupled to said output of said logic circuit, said fine lock detector detecting a phase lock within a second window of time that is shorter in duration than said first window of time; and
      a combine circuit receiving an output of said coarse lock detector and an output of said fine lock detector and generating a final lock-detect output signal.

10. The circuit of claim 9 wherein said fine lock detector circuit further comprises a disable input coupled to an output of said coarse lock detector.

11. The circuit of claim 10 wherein said coarse lock detector defines said first window of time by a current source charging a capacitor and a switch discharging said capacitor in response to said combined pulse.

12. The circuit of claim 10 wherein said fine lock detector defines said second window of time by widening a duration of said combined pulse by a predetermined delay.

13. The circuit of claim 11 wherein said coarse lock detector further comprises a hysteresis circuit for reducing a chattering of the signal at its output.

14. The circuit of claim 12 wherein said fine lock detector further comprises an integrating circuit that integrates the results of the detection to reduce a chattering of the signal at its output.

15. A method for detecting a phase lock condition for a phase-locked loop (PLL), the method comprising the steps of:

tapping an output signal of a phase comparator inside the PLL;

generating a phase error pulse in response to said output signal of said phase comparator;

defining a first window of time having a first duration;

defining a second window of time having a second duration that is shorter than said first duration comparing a duration of said phase error pulse against said first window of time and said second window of time; and generating a lock valid signal in response to said step of comparing.

16. The method of claim 15 wherein said step of comparing comprises the steps of:

comparing a duration of said phase error pulse against said first window of time, and generating a first detect output; and comparing a duration of said phase error pulse against said second window of time, and generating a second detect output.

17. The method of claim 16 wherein said step of generating a lock valid signal comprises a step of combining said first detect output with said second detect output.

18. The method of claim 17 wherein said step of comparing a duration of said phase error pulse against said first window of time further comprises the steps of:

supplying a current having a predefined magnitude;

charging a capacitor with said current in response to said phase error pulse;

discharging said capacitor in response to said phase error pulse; and comparing a voltage level on said capacitor against a predefined threshold level.

19. The method of claim 17 wherein said step of comparing a duration of said phase error pulse against said second window of time further comprises the steps of:

widening a width of said error phase error pulse by an amount substantially equal to said second window of time to generate a wider error pulse; and comparing a duration of said wider error pulse against said phase error pulse.

* * * * *